United States Patent

(12) United States Patent
Nogawa

(10) Patent No.: US 12,069,351 B2
(45) Date of Patent: Aug. 20, 2024

(54) IMAGE CAPTURING APPARATUS COMPRISING COOLING CAPABILITY BASED ON TEMPERATURE DETECTION, CONTROL METHOD THEREOF, AND STORAGE MEDIUM

(71) Applicant: CANON KABUSHIKI KAISHA, Tokyo (JP)

(72) Inventor: Yuki Nogawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 27 days.

(21) Appl. No.: 18/192,792

(22) Filed: Mar. 30, 2023

(65) Prior Publication Data

US 2023/0345096 A1   Oct. 26, 2023

(30) Foreign Application Priority Data

Apr. 20, 2022   (JP) .................................. 2022-069590

(51) Int. Cl.
*H04N 23/52*   (2023.01)
*G03B 17/55*   (2021.01)
(Continued)

(52) U.S. Cl.
CPC ............. *H04N 23/52* (2023.01); *G03B 17/55* (2013.01); *H04N 23/50* (2023.01); *H04N 23/54* (2023.01);
(Continued)

(58) Field of Classification Search
CPC ........ H04N 23/52; H04N 23/50; H04N 23/51; H04N 23/54; H04N 23/57; H04N 25/63; G03B 17/55; G03B 17/02; G03B 2217/00; G03B 2217/002; H05K 7/20209; H05K 7/20281; H05K 7/2039
See application file for complete search history.

(56) References Cited

U.S. PATENT DOCUMENTS 7,755,687 B2 * 7/2010 Fukushima ............ H04N 23/54
348/300
9,383,540 B1 * 7/2016 Gandhi .................. G02B 7/008
(Continued)

FOREIGN PATENT DOCUMENTS

JP   2009017050 A  *  1/2000   ............. H04N 23/00
JP   2005-354258 A   12/2005
(Continued)

*Primary Examiner* — Twyler L Haskins
*Assistant Examiner* — Akshay Trehan
(74) *Attorney, Agent, or Firm* — Cowan, Liebowitz & Latman, P.C.

(57) ABSTRACT

An image capturing apparatus includes an image sensor, a temperature unevenness detection device configured to detect unevenness in a temperature of the image sensor, a exterior cover temperature detection device configured to detect an exterior cover temperature at a predetermined position on the image capturing apparatus, a cooling device configured to cool the image capturing apparatus; and a control unit configured to perform control to change a cooling capability of the cooling device based on a value detected by the temperature unevenness detection device, and on a value detected by the exterior cover temperature detection device.

16 Claims, 3 Drawing Sheets

(51) Int. Cl.
*H04N 23/50* (2023.01)
*H04N 23/54* (2023.01)
*H04N 23/57* (2023.01)
*H04N 25/63* (2023.01)
*H05K 7/20* (2006.01)

(52) U.S. Cl.
CPC ............ *H04N 23/57* (2023.01); *H04N 25/63* (2023.01); *H05K 7/20209* (2013.01); *H05K 7/20281* (2013.01); *H05K 7/2039* (2013.01)

(56) References Cited

U.S. PATENT DOCUMENTS

2018/0336398 A1* 11/2018 Shenoy ................. G06F 1/3206
2019/0154949 A1*  5/2019 Hosoe ................. G05D 23/1919

FOREIGN PATENT DOCUMENTS

| JP | 2009-017050 A |   | 1/2009 |   |
|----|---------------|---|--------|---|
| JP | 2019201386 A  | * | 11/2019 | ............. H04N 25/00 |
| JP | 2019201386 A  |   | 11/2019 |   |

\* cited by examiner

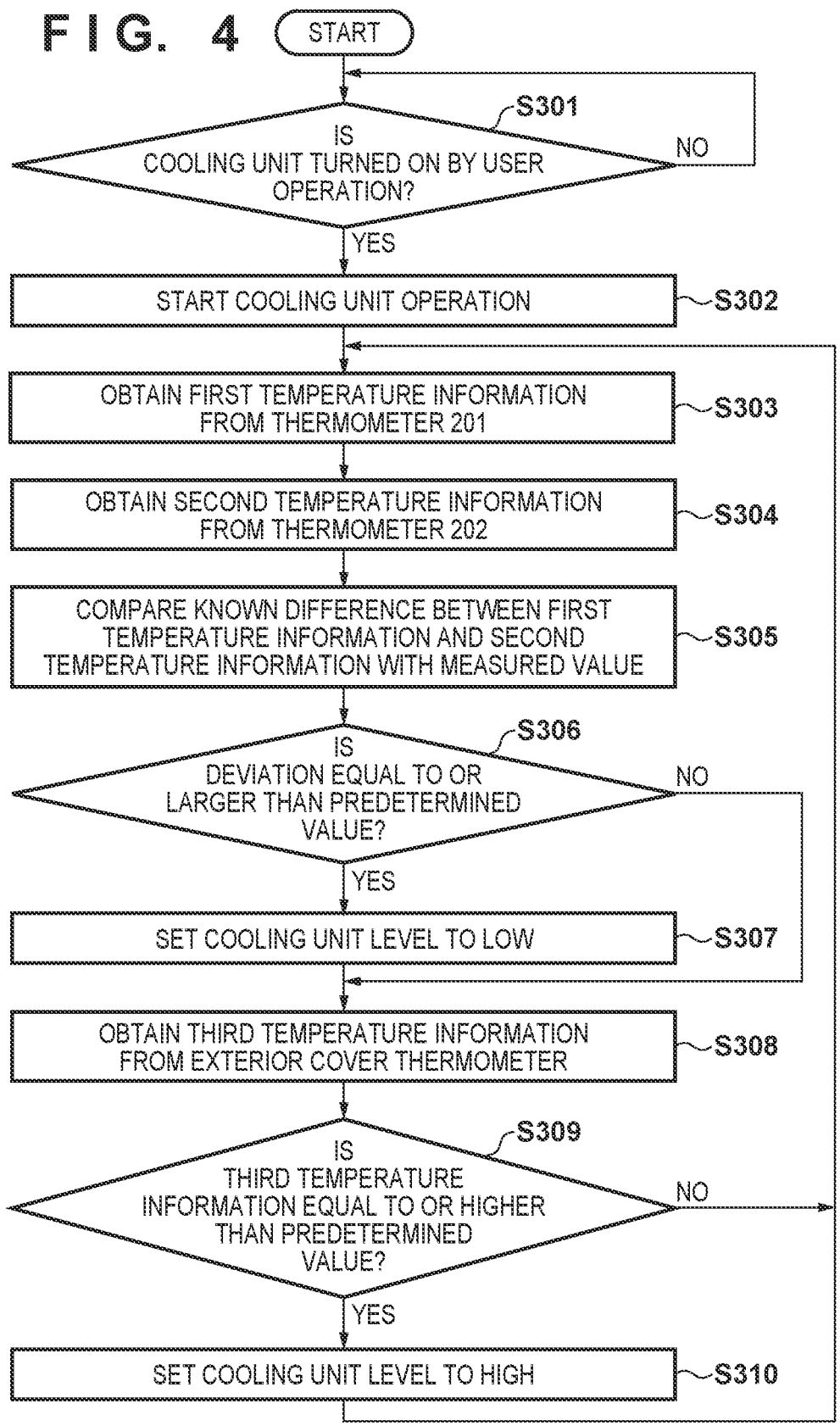

IMAGE CAPTURING APPARATUS COMPRISING COOLING CAPABILITY BASED ON TEMPERATURE DETECTION, CONTROL METHOD THEREOF, AND STORAGE MEDIUM

BACKGROUND OF THE INVENTION

Field of the Invention

The present invention relates to a cooling technique for an image capturing apparatus.

Description of the Related Art

In recent years, the advancements in the moving image shooting functions have fostered improvements in the image quality, such as 4K/8K, and the frame rate of image capturing apparatuses, and there is a tendency toward an increase in power consumption of the apparatuses. The increase in power consumption promotes an increase in the temperature inside the image capturing apparatuses, which makes it necessary to take measures so that the temperature inside the apparatuses does not exceed the insured temperatures of electronic components.

Furthermore, the increase in the temperature inside the image capturing apparatuses not only influences the operations of electronic components as mentioned above, but also influences the image quality. This is because the increase in the temperature causes an increase in dark current noise in an image sensor.

Under the foregoing circumstances, Japanese Patent Laid-Open No. 2005-354258 discloses the following technique. First, an exposure condition equivalent to the product of an exposure period and an image capturing sensitivity, as well as a temperature condition of an image sensor, is referenced. Then, the operations of cooling means are controlled based on the S/N ratio of an image signal, which can be assumed from a random noise amount that is barely dependent on the temperature and a dark current noise amount that is dependent on the temperature.

However, with the conventional technique disclosed in Japanese Patent Laid-Open No. 2005-354258, the temperature distribution is uneven on a surface of the image sensor depending on the location to be cooled. When there is unevenness in the temperature on the surface of the image sensor, the dark current noise level also becomes uneven, which consequently appears as shading in the image quality, thereby lowering the image quality.

SUMMARY OF THE INVENTION

The present invention has been made in view of the aforementioned problem, and suppresses shading that appears in an image on an image capturing apparatus that has a cooling function.

According to a first aspect of the present invention, there is provided an image capturing apparatus that includes an image sensor, the image capturing apparatus comprising: a temperature unevenness detection device configured to detect unevenness in a temperature of the image sensor; a exterior cover temperature detection device configured to detect an exterior cover temperature at a predetermined position on the image capturing apparatus; a cooling device configured to cool the image capturing apparatus; and at least one processor or circuit configured to function as a control unit configured to perform control to change a cooling capability of the cooling device based on a value detected by the temperature unevenness detection device, and on a value detected by the exterior cover temperature detection device.

According to a second aspect of the present invention, there is provided a method of controlling an image capturing apparatus that includes an image sensor, the method comprising: detecting unevenness in a temperature of the image sensor; detecting an exterior cover temperature at a predetermined position on the image capturing apparatus; cooling the image capturing apparatus; and performing control to change a cooling capability in the cooling based on a value detected in the detecting of the unevenness in the temperature, and on a value detected in the detecting of the exterior cover temperature.

Further features of the present invention will become apparent from the following description of exemplary embodiments with reference to the attached drawings.

BRIEF DESCRIPTION OF THE DRAWINGS

FIG. 4 is a flowchart showing a procedure of a cooling operation according to an embodiment.

DESCRIPTION OF THE EMBODIMENTS

Figure 1:
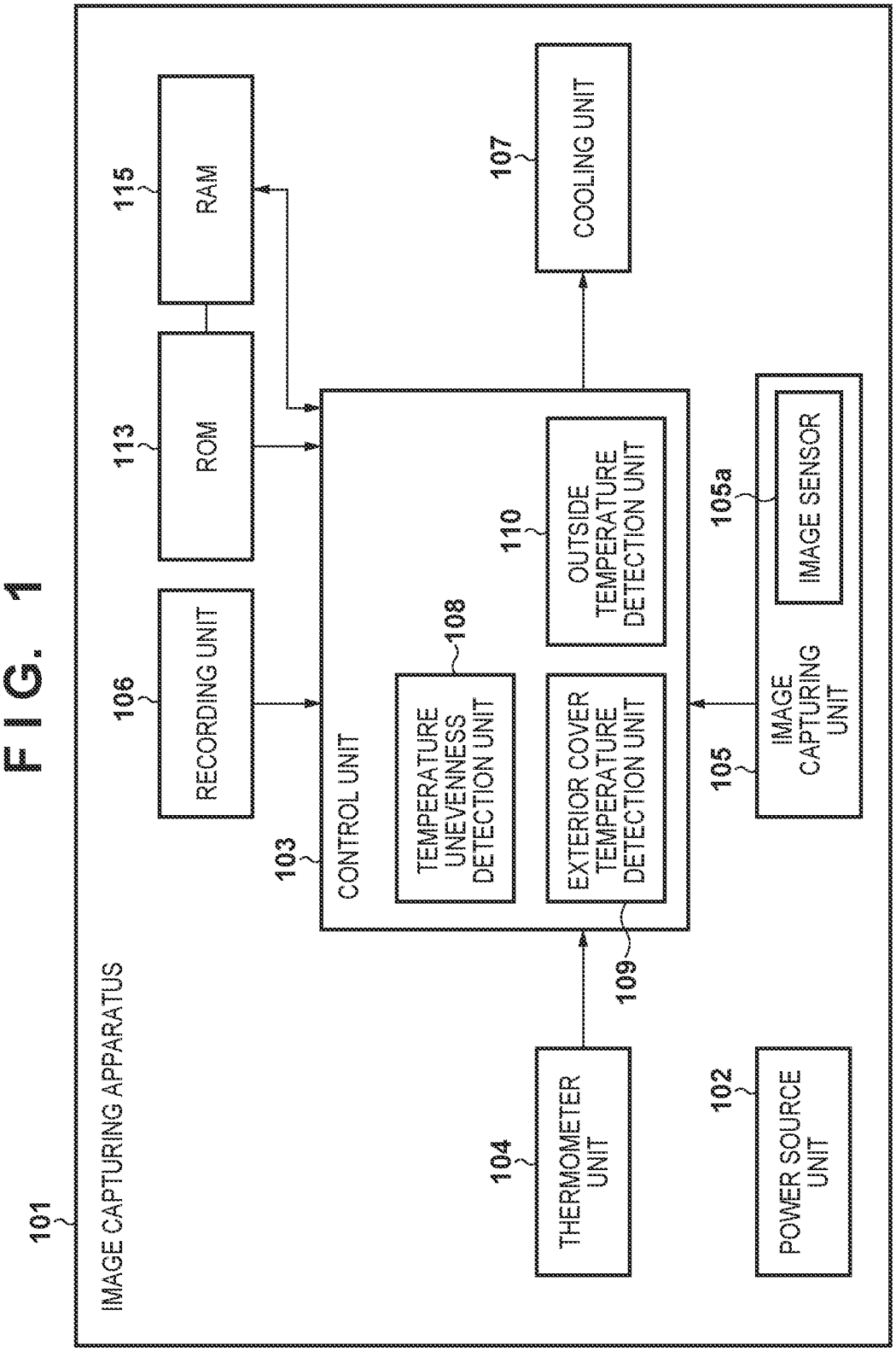
FIG. 1 is a block diagram showing a configuration of an image capturing apparatus according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a block diagram showing a configuration of an image capturing apparatus 101 according to an embodiment of the present invention.

The image capturing apparatus 101 is configured to include a power source unit 102, a control unit 103, thermometer units 104, an image capturing unit 105, a recording unit 106, a cooling unit 107, a ROM 113, and a RAM 115.

The power source unit 102, for example, converts a voltage supplied from a supply source, such as a non-illustrated battery or AC adapter, into a desired voltage, and supplies the desired voltage to each electronic component of the image capturing apparatus 101.

The control unit 103 controls the entirety of the image capturing apparatus 101, which includes the thermometer units 104, the image capturing unit 105, the recording unit 106, the cooling unit 107, and other constituents, by deploying a control program stored in the ROM 113 to the RAM 115 and executing the control program. Furthermore, as a result of the execution of the aforementioned control program by the control unit 103, modules that respectively act as a temperature unevenness detection unit 108, an exterior cover temperature detection unit 109, and an outside temperature detection unit 110 are configured inside the control unit 103.

It is sufficient for the thermometer units 104 to be capable of measuring the temperature inside the image capturing apparatus 101; for example, thermistors or digital thermometers are used thereas.

The image capturing unit 105 includes an image sensor 105a composed of a CMOS sensor, a CCD, or the like, and transmits obtained video information to the control unit 103. Furthermore, in the present embodiment, information of an optical black unit (hereinafter referred to as an OB unit) of the image sensor 105a is transmitted to the control unit 103. The OB unit is a portion that is mechanically masked (blocked from light) so that a peripheral portion of the image sensor 105a does not receive light. In this OB unit, as light is always blocked, dark current noise can always be obtained on a per-pixel basis for use in the temperature unevenness detection unit 108, which will be described later.

The recording unit 106 is a nonvolatile memory that can hold information even if a power source is not supplied thereto, and stores known temperature distribution information in the present embodiment. The temperature distribution information refers to a plurality of pieces of temperature information of the same thermal path, which have been measured in advance and which bear temperature correlations, in a specific operation mode of the image capturing apparatus 101. This known temperature distribution information is used in the temperature unevenness detection unit 108, which will be described later.

It is sufficient for the cooling unit 107 to be means capable of cooling the image capturing apparatus 101; for example, an air blower, a circulator that circulates liquid for cooling, a Peltier device, or the like is used thereas. Furthermore, the cooling capability can be changed via the amount of current applied to the air blower, circulator, or Peltier device; the cooling capability is changed by an instruction from the control unit 103. In addition, although the cooling unit 107 is described as being built in the image capturing apparatus 101 in the present embodiment, the cooling unit 107 may be configured to be externally mountable separately from the image capturing apparatus 101.

The temperature unevenness detection unit 108 detects whether the temperature on a surface of the image sensor 105a has become uneven. Any means can be used as long as the unevenness in the temperature can be detected. Specifically, there is a method that detects an event where the difference between an actual temperature distribution and a known temperature distribution has become equal to or larger than a predetermined value from the known temperature distribution information recorded in the recording unit 106 and the results of measurement performed by (the values detected by) the plurality of thermometer units 104. For example, a method that detects unevenness in the OB level of the image sensor 105a on a per-pixel basis may be used.

It is sufficient for the exterior cover temperature detection unit 109 to be capable of detecting the temperature at a predetermined position on an exterior cover of the image capturing apparatus 101; for example, the thermometer units 104 may be placed on the inner side of the exterior cover. Furthermore, temperature information of the exterior cover may be obtained from an external apparatus that is separate from the image capturing apparatus 101.

The outside temperature detection unit 110 can use any means as long as it can detect the outside temperature. For example, the outside temperature may be measured by placing the thermometer units 104 at locations that are not easily influenced by heat generated by the image capturing apparatus 101, or may be predicted using temperature information of the plurality of thermometer units 104. Furthermore, information of the outside temperature may be obtained from an external apparatus that is separate from the image capturing apparatus 101.

Next, cooling control for the image capturing apparatus according to the present embodiment will be described with reference to FIG. 2, FIG. 3, and FIG. 4.

First, a configuration of the thermometer units 104 inside the image capturing apparatus 101 according to the present embodiment will be described using FIG. 2.

Figure 2:
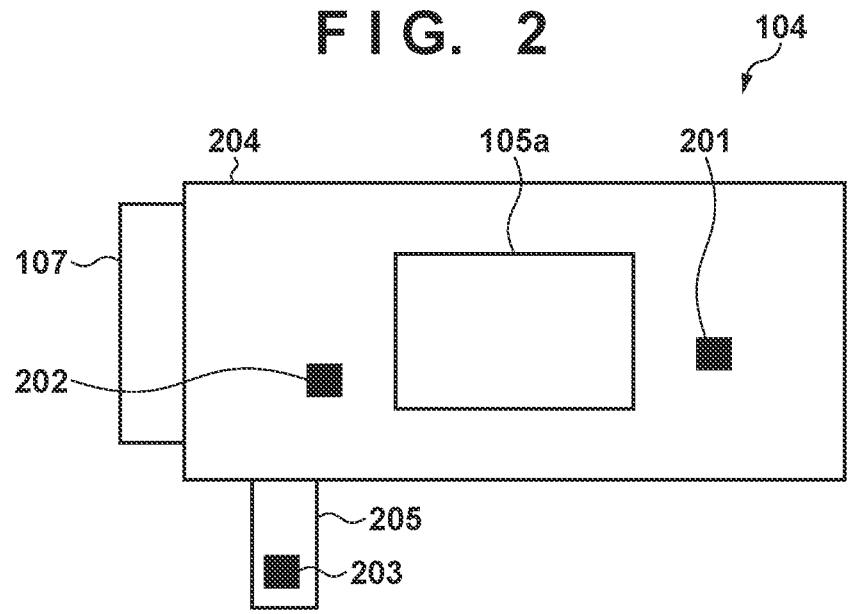
FIG. 2 is a diagram showing a configuration of thermometer units.

In FIG. 2, a substrate 204 is a printed circuit board on which electrical components are mounted. Thermometers 201 and 202 for detecting unevenness in the temperature of the image sensor 105a are placed on the substrate 204 at positions that are on the right and left of the image sensor 105a. First temperature information can be obtained from the thermometer 201, and second temperature information can be obtained from the thermometer 202.

A substrate 205 is composed of a thin and bendable FPC (Flexible Printed Circuits), and is connected to the substrate 204 via a connector. A thermometer 203 for measuring the exterior cover temperature is placed on the substrate 205. In order to monitor the temperature of a holding portion that is used by a user to hold the image capturing apparatus 101 (hereinafter, a grip portion), the thermometer 203 is placed in the vicinity of an exterior cover of the grip portion. Third temperature information, which is temperature information of the grip portion, can be obtained from the thermometer 203. Also, the cooling unit 107 is placed on the left side of the substrate 204 in the figure in order to cool the grip portion.

Next, the operations of cooling control according to the present embodiment will be described using FIG. 3 and FIG. 4.

Figure 3:
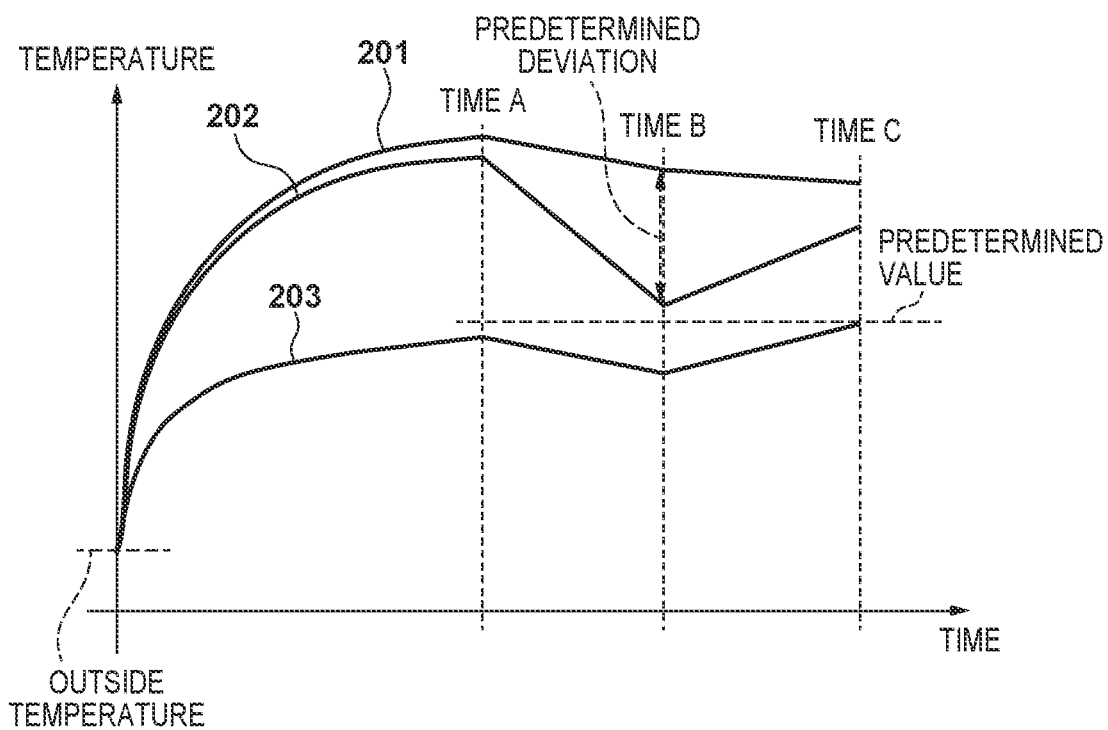
FIG. 3 is a diagram showing the temperature transitions of thermometers.

FIG. 3 is a diagram showing the temperature transitions of the thermometers 201, 202, and 203 after starting a specific operation mode of the image capturing apparatus 101 (e.g., shooting at a resolution of 4K and a frame rate of 60P). A vertical axis indicates temperatures, and a horizontal axis indicates periods that have elapsed.

In FIG. 2, time A, time B, and time C indicate the timings at which the operation of the cooling unit 107 changes. At time A, the control unit 103 causes a transition in the operation of the cooling unit 107 from "stop" to "strong" cooling capability. At time B, the control unit 103 causes a transition in the operation of the cooling unit 107 from "strong" cooling capability to "weak" cooling capability. At time C, the control unit 103 causes a transition in the operation of the cooling unit 107 from "weak" cooling capability to "strong" cooling capability. More details of cooling control according to the present embodiment will be described with reference to a flowchart of FIG. 4.

FIG. 4 is a flowchart showing a procedure of a cooling operation according to the present embodiment. The operation of this flowchart is realized by the control unit 103 deploying the control program stored in the ROM 113 to the RAM 115 and executing the control program.

First, in step S301, the control unit 103 determines whether an instruction for starting the operation of the cooling unit 107 has been input via a user operation. In a case where the instruction for starting the operation has not been input, the control unit 103 stands by as is; in a case where the instruction for the operation has been input, processing proceeds to step S302.

In step S302, the control unit 103 causes the cooling unit 107 to operate with "strong" cooling capability (time A of FIG. 3). Here, the instruction for starting the operation may be issued via an entity other than the user operation; for example, the instruction for starting the operation may be output in a case where the temperature of the thermometer 203, which monitors the exterior cover temperature of the image capturing apparatus 101, is equal to or higher than a predetermined value.

In steps S303 to S306, the control unit 103 detects whether the temperature on the surface of the image sensor 105a has become uneven due to the influence of the cooling operation of the cooling unit 107.

Specifically, the control unit 103 obtains the first temperature information from the thermometer 201 in step S303, and obtains the second temperature information from the thermometer 202 in step S304.

In step S305, the control unit 103 compares the difference between the known first temperature information and second temperature information that are stored in the recording unit 106 with the difference between the first temperature information and the second temperature information that have been actually measured, and calculates a deviation.

In step S306, the control unit 103 determines whether the deviation calculated in step S305 is equal to or larger than a predetermined value (e.g., 6° C.). In a case where the deviation has become equal to or larger than the predetermined value in step S306 (time B of FIG. 3), the control unit 103 causes processing to proceed to step S307; otherwise, it causes processing to proceed to step S308.

In step S307, the control unit 103 outputs a command for lowering the cooling capability to the cooling unit 107. The predetermined value used in the determination about the deviation in step S306 is a value that is smaller than a level at which a shading level is not tolerable.

As a result of the control unit 103 lowering the cooling capability of the cooling unit 107 in the above-described manner, unevenness in the temperature of the image capturing unit 105 decreases, and shading can be reduced. Note that, as a modification example, it is possible to provide a mode in which a decline in the shading level is tolerated without lowering the cooling capability.

In steps S308 to S309, the control unit 103 detects the temperature of the grip portion of the image capturing apparatus 101.

Specifically, in step S308, the control unit 103 obtains the third temperature information, which is temperature information of the grip portion, from the thermometer 203.

In step S309, the control unit 103 determines whether the third temperature information is equal to or higher than a predetermined value. This predetermined value is obtained by adding an offset value corresponding to the outside temperature detected by the outside temperature detection unit 110 to a reference temperature, which is, for example, 42° C. For example, "the offset value=the outside temperature−23° C." is used as the offset value. Specifically, in a case where the obtained outside temperature is 30° C., the offset value is 30° C.−23° C.=+7° C. That is to say, the predetermined value in this case is 42° C.+7° C.=49° C. In step S309, in a case where the third temperature information is equal to or higher than his predetermined value, the control unit 103 determines that the exterior cover needs to be cooled, and processing proceeds to step S310. Otherwise, processing returns to step S303 to repeat the determination of whether the temperature on the surface of the image sensor 105a has become uneven and the determination of whether the exterior cover temperature has reached the predetermined value, which have been described above.

In step S310, the control unit 103 increases the cooling capability by outputting a command for increasing the cooling capability to the cooling unit 107 (time C of FIG. 3). In the present embodiment, the cooling unit 107 is caused to operate with "strong" cooling capability.

As described above, according to the present embodiment, the determination of whether the temperature on the surface of the image sensor 105a has become uneven, and the determination of whether the exterior cover temperature has reached the predetermined value, are repeated. Then, in accordance with these determinations, the cooling capability of the cooling unit 107 is changed between strong and weak. This enables the operations of the image capturing apparatus 101 to be continued while keeping the shading level and the temperature of the grip portion within predetermined ranges.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-069590, filed Apr. 20, 2022, which is hereby incorporated by reference herein in its entirety.

What is claimed is:

1. An image capturing apparatus that includes an image sensor, the image capturing apparatus comprising:
   a temperature unevenness detection device configured to detect unevenness in a temperature of the image sensor;
   a exterior cover temperature detection device configured to detect an exterior cover temperature at a predetermined position on the image capturing apparatus;
   a cooling device configured to cool the image capturing apparatus; and
   at least one processor or circuit configured to function as
   a control unit configured to perform control to change a cooling capability of the cooling device based on a value detected by the temperature unevenness detection device, and on a value detected by the exterior cover temperature detection device.

2. The image capturing apparatus according to claim 1, wherein
the control unit lowers the cooling capability of the cooling device in a case where the value detected by the temperature unevenness detection device has become equal to or larger than a first predetermined value, and increases the cooling capability of the cooling device in a case where the value detected by the exterior cover temperature detection device has become equal to or larger than a second predetermined value.

3. The image capturing apparatus according to claim 2, further comprising
an outside temperature detection device configured to detect an outside temperature, wherein the control unit adds an offset to the second predetermined value based on a value detected by the outside temperature detection device.

4. The image capturing apparatus according to claim 3, wherein
the outside temperature detection device is located at a position that is not easily influenced by heat generated by the image capturing apparatus.

5. The image capturing apparatus according to claim 3, wherein
the outside temperature detection device predicts an outside temperature using temperatures of a plurality of temperature detection devices.

6. The image capturing apparatus according to claim 3, wherein
the outside temperature detection device obtains information of an outside temperature from outside the image capturing apparatus.

7. The image capturing apparatus according to claim 1, wherein
the temperature unevenness detection device detects the unevenness in the temperature of the image sensor by comparing temperature distribution information of an inside of the image capturing apparatus which has been stored in advance and which pertains to a case where the image capturing apparatus is in operation, with actual temperature distribution information of the inside of the image capturing apparatus.

8. The image capturing apparatus according to claim 1, wherein
the temperature unevenness detection device detects the unevenness in the temperature of the image sensor based on a signal of a portion of the image sensor that is blocked from light.

9. The image capturing apparatus according to claim 1, wherein
the exterior cover temperature detection device is located in the vicinity of a grip portion of the image capturing apparatus.

10. The image capturing apparatus according to claim 1, wherein
the exterior cover temperature detection device obtains information of an exterior cover temperature from outside the image capturing apparatus.

11. The image capturing apparatus according to claim 1, wherein
the cooling device is provided separately from the image capturing apparatus.

12. The image capturing apparatus according to claim 1, wherein
the cooling device is a cooling device that uses a Peltier device.

13. The image capturing apparatus according to claim 1, wherein
the cooling device is a cooling device that uses an air blower.

14. The image capturing apparatus according to claim 1, wherein
the cooling device is a cooling device that performs cooling by circulating liquid.

15. A method of controlling an image capturing apparatus that includes an image sensor, the method comprising:
detecting unevenness in a temperature of the image sensor;
detecting an exterior cover temperature at a predetermined position on the image capturing apparatus;
cooling the image capturing apparatus; and
performing control to change a cooling capability in the cooling based on a value detected in the detecting of the unevenness in the temperature, and on a value detected in the detecting of the exterior cover temperature.

16. A non-transitory computer-readable storage medium having stored therein a program for causing a computer to execute each step of a method of controlling an image capturing apparatus that includes an image sensor, the method comprising:
detecting unevenness in a temperature of the image sensor;
detecting an exterior cover temperature at a predetermined position on the image capturing apparatus;
cooling the image capturing apparatus; and
performing control to change a cooling capability in the cooling based on a value detected in the detecting of the unevenness in the temperature, and on a value detected in the detecting of the exterior cover temperature.

* * * * *